United States Patent [19]
Carcia et al.

[11] Patent Number: 5,897,977
[45] Date of Patent: Apr. 27, 1999

[54] ATTENUATING EMBEDDED PHASE SHIFT PHOTOMASK BLANKS

[75] Inventors: Peter Francis Carcia; Roger Harquail French, both of Wilmington, Del.

[73] Assignee: E. I. du Pont de Nemours and Company, Wilmington, Del.

[21] Appl. No.: 08/797,443

[22] Filed: Feb. 10, 1997

Related U.S. Application Data

[60] Provisional application No. 60/017,989, May 20, 1996.

[51] Int. Cl.$^6$ .................................................... G03F 9/00
[52] U.S. Cl. .............................................. 430/5; 428/433
[58] Field of Search ....................... 430/5, 322; 428/433

[56] References Cited

U.S. PATENT DOCUMENTS

| | | | |
|---|---|---|---|
| 5,106,703 | 4/1992 | Carcia | 428/635 |
| 5,415,953 | 5/1995 | Alpay et al. | 430/5 |
| 5,459,002 | 10/1995 | Alpay et al. | 430/5 |

FOREIGN PATENT DOCUMENTS

| | | |
|---|---|---|
| 0 567 169 A1 | 10/1993 | European Pat. Off. . |
| 0 620 497 A2 | 10/1994 | European Pat. Off. . |
| 0 643 331 A2 | 3/1995 | European Pat. Off. . |
| 0 686 876 A2 | 12/1995 | European Pat. Off. . |
| 6-282066 | 10/1994 | Japan . |
| 7-5676 | 1/1995 | Japan . |
| 7-175203 | 7/1995 | Japan . |
| 7-181664 | 7/1995 | Japan . |
| 7-199447 | 8/1995 | Japan . |
| 7-209849 | 8/1995 | Japan . |
| 7-225467 | 8/1995 | Japan . |
| 2 284 070 | 5/1995 | United Kingdom . |
| 94/17449 | 8/1994 | WIPO . |

OTHER PUBLICATIONS

Levenson, M.D., Wavefront Engineering For Photolithography, *Physics Today*, 28–36, Jul. 1993.

Stix, G., Toward "Point One", *Scientific American*, 90–95, Feb. 1995.aa

McLane, G.F., et al., Magnetron reactive ion etching of AlN and InN in $BCl_3$ plasmas, *Journal of Vacuum Science & Technology*, A13(3), 724–726, Sep. 1995.

Shih, K.K. et al., Thin film materials for the preparation of attenuating phase shift masks, *Journal of Vacuum Science & Technology*, B12(1), 32–36, Jan./Feb. 1994.

Mileham, J.R. et al., Wet chemical etching of AlN, *Appl. Phys. Lett.*, 67(8), 1119–1121, Aug. 1995.

Kalk, F.D. et al. Attenuated phase–shifting photomasks fabricated from Cr–based embedded shifter blanks, *Photomask and X–Ray Mask Technology*, SPIE vol. 2254, 64–70, Apr. 1994.

Shul, R.J. et al., High rate electron cyclotron resonance etching of GaN, InN, and AlN, *Journal of Vacuum Science Technology*, B13(5), 2016–2021, Sep./Oct. 1995.

Carcia, P.F., Evolution of Metal Multilayers For MO Recording, *Proceeding of Magneto–Optical Recording International Symposium '94, Magn. Soc. Jpn.*, vol. 19, 5–16 Mar. 1994.

P.F. Carcia et al., Materials screening for attenuating embedded phase–shift photoblanks for DUV and 193 nm photolithography, *Proceedings of 16th Annual Symposium on Photomask Technology and Management*, 2884, 255–263, Sep. 1996.

*Primary Examiner*—S. Rosasco

[57] ABSTRACT

Attenuating embedded phase shift photomask blanks capable of producing a 180° phase shift with an optical transmissivity of at least 0.0001 at wavelengths <400 nm comprise alternating layers, either periodic or aperiodic, of an optically transmissive material and an optically absorbing material and are made by depositing alternating layers of optically transmissive material and optically absorbing material on a substrate, preferably by vapor deopsition.

18 Claims, 8 Drawing Sheets

ATTENUATING EMBEDDED PHASE SHIFT PHOTOMASK BLANKS

This application claims Domestic Priority to Provisional Appl. 60/017,989 filed May 20, 1996, now abandoned.

BACKGROUND OF THE INVENTION

This invention relates to phase shift photomask blanks in photolithography with short wavelength (i.e., <400 nm) light. More specifically this invention relates to phase shift photomask blanks that attenuate and change the phase of transmitted light by 180° relative to light propagating the same path length in air. Such photomask blanks are commonly known in the art as attenuating (embedded) phase shift photomask blanks or half-tone phase shift photomask blanks. Still more particularly, this invention proposes novel attenuating embedded phase-shift photomask blanks, whose optical properties can be engineered at any wavelength by multilayering ultrathin UV transparent layers, periodically or aperiodically, with ultrathin UV absorbing layers.

The electronics industry seeks to extend optical lithography for manufacture of high density integrated circuits to critical dimensions of 0.25 mm and smaller. To achieve this, lithographic photomask blanks will need to work with short wavelength light, i.e. <400 nm. Two wavelengths targeted for future optical lithography are 248 nm (KrF laser wavelength) and 193 nm (ArF laser wavelength). A phase shift mask enhances the patterned contrast of small circuit features by destructive optical interference.

The concept of a phase shift photomask blank that attenuates light and changes its phase was revealed by H. I. Smith in U.S. Pat. No. 4,890,309 ("Lithography Mask with a p-Phase Shifting Attenuator"). Known attenuating embedded phase shift photomask blanks fall mainly into two categories: (1) Cr-based photomask blanks containing Cr, Cr-oxide, Cr-carbide, Cr-nitride, Cr-fluoride or combinations thereof; and (2) $SiO_2$- or $Si_3N_4$-based photomask blanks containing $SiO_2$ or $Si_3N_4$ together with a predominantly opaque material, such as MoN or $MoSi_2$. Commonly the latter materials are referred to generically as 'MoOSiN'. Cr-based photomask blanks have the advantage that they are chemically durable and can use most of the familiar processing steps developed for opaque Cr photomask blanks. The second category of photomask blanks based on $SiO_2$- or $Si_3N_4$ exploit their transparency into the deep UV and ease of dry etching with more innocuous fluorine-base chemistry. However, the need to develop photomask blanks for even shorter wavelengths (<200 nm) renders Cr chemistries less desireable because photomask blanks based exclusively on Cr (i.e., oxides, nitrides, carbides, fluorides or combinations thereof) are too optically absorbing at such wavelengths. The disadvantage of 'MoSiON' photomask blanks in this short wavelength regime is that they are too Si-rich and consequently have poor etch selectivity relative to the quartz ($SiO_2$) substrate. Thus, they require an etch stop, an additional layer of a material which etches poorly in a fluorine etchant.

In addition, there are references in the literature to attenuating embedded phase shift photomask blanks comprising hydrogenated amorphous carbon layers, tantalum and its compounds with a layer of Cr metal, or one or more layers composed of a hafnium compound.

Practical phase shift photomask blanks require tailorable transmissivity at the operating wavelength (<400 nm) and at the inspection wavelength (typically 488 nm). Additional desirable properties include electrical conductivity for permitting electron-beam patterning, dry-etchability with selectivity to the photoresist and the quartz substrate, environmental, chemical, and radiation stability. It would also be advantageous, if the same process could be used to fabricate photomask blanks with the needed optical properties at different wavelengths.

It is common in the art to modify the chemistry of the topmost layer of, or add a layer to a binary or phase shift photomask blank, so that it is anti-reflective or more chemically robust. Although these photomask blanks then contain "multiple" layers in the sense that they have at least two layers, these additional layers do not tailor the optical transmissivity and transmitted phase of the photomask blank.

SUMMARY OF THE INVENTION

In one aspect, the invention comprises an attenuating embedded phase shift photomask blank capable of producing a phase shift of 180° with an optical transmissivity of at least 0.001 at a selected lithographic wavelength <400 nm, which comprises alternating layers of an optically transparent material and an optically absorbing material.

In another aspect, the invention comprises a process of making attenuating embedded phase shift photomask blank capable of producing a phase shift of 180° with an optical transmissivity of at least 0.001 at a selected lithographic wavelength <400 nm, which process comprises the steps of depositing alternating layers of an optically transparent material and an optically absorbing material onto a substrate.

These and other features of the invention will become apparent upon a further reading of this specification with reference to the drawings, and the appended claims.

DETAILED DESCRIPTION OF THE EMBODIMENTS

Figure 1:
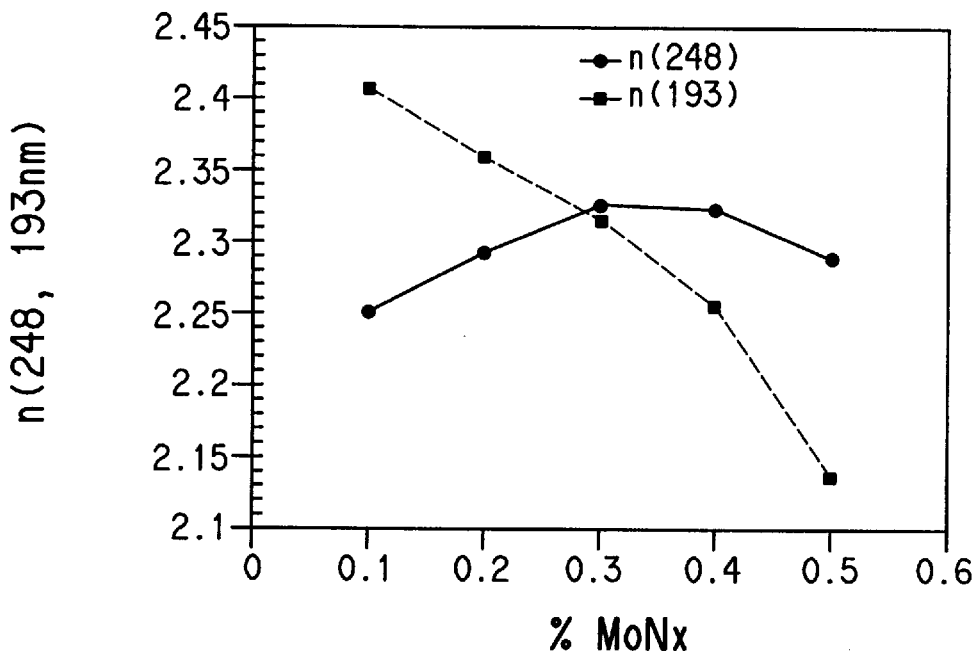
FIG. 1 is a graph showing the relationship between the index of refraction (n) and the % $MoNx$ in $AlN/MoNx$ photomask blanks of this invention.

As is known in the art, a "photomask blank" differs from a "photomask" in that the latter term is used to describe a photomask blank after it has been imaged. While every attempt has been made to follow that convention herein, those skilled in that art will appreciate the distinction is not a material aspect of this invention. Accordingly, it is to be understood that the term "photomask blanks" is used herein in the broadest sense to include both imaged and non-imaged photomask blanks.

Optical multilayers of this invention are comprised of alternating continuous layers of an optically transparent layer (T) with an optically absorbing layer (A), designed to produce a phase shift of 180° with a transmissivity of at least 0.001. These multilayers can be periodic (the same thicknesses of T and A are maintained throughout the stack), or aperiodic (thicknesses of T and A change throughout the stack). As an example, the chemistry of the multilayers of this invention can be expressed as 20×(35 Å AlN+15 Å CrN), representing periodic, alternating layers of 35 Å thick AlN, a UV transmitting layer, with 15 Å CrN, a UV absorbing layer, repeated 20 times with a total film thickness of 1000 Å.

As used herein, an "optically transparent" material or layer (T) is one with an extinction coefficient k<0.3 within the range 3 eV<E<7 eV. Examples of optically transparent materials include oxides of Hf, Y, Zr, Al, Si, and Ge; nitrides of Al, Si, B, C; and fluorides of Mg, Ba, and Ca. An "optically absorbing" material or layer (A) is one with an extinction coefficient k>0.3 within the range 3 eV<E<7 eV. Examples of optically absorbing materials include oxides of Cr, Ti, Fe, In, Co, Bi, Mn, Cu, Sn, Ni, V, Ta, Mo, Ru and W; nitrides of Ti, Nb, Mo, W, Ta, Hf, Zr, and Cr; and elemental metals such as Pt, Au, Pd, Ru and Rh.

The thickness ratio of A/T<5, with preferred range A/T<1, such that the overall stack has a transmission of at least 0.001 at the lithographic wavelength. The total thickness of the stack, d is chosen to produce a 180° phase shift at the lithographic optical wavelength 1, corresponding approximately to the condition 2(n−1)d=½ or an odd multiple thereof. The total number of individual transmitting and absorbing layers N>2, corresponding to at least 4 layers. Individual layer thicknesses of A and T are consistent with d and are subject to the optical design.

Photomask blanks of alternating layers of an optically transparent compound and an optically absorbing compound were made by sputtering from separate metal targets in partial pressures of Ar and other reactive gases such as $N_2$ or $O_2$. The targets were physically apart so that their sputtered fluxes did not overlap. Both targets were operated in the same sputtering gas environment, although the power applied to each target, and consequently its sputtering rate, was usually different. Multilayer growth proceeded by pausing substrates on a rotatable table under each target consecutively. The chemical composition of films was adjusted by the thickness of individual layers, controlled by their deposition rates and the length of time substrates were paused under each target. Alternatively, the substrates could be rotated continuously at a constant rate and individual layer thicknesses fixed by sputtering rates. When substrates were paused under targets, the times that they were stationary could be programmed so as to produce either periodic or aperiodic multilayer structures.

Optical Properties

The optical properties (index of refraction, n and extinction coefficient, k) were determined from variable angle spectroscopic ellipsometry at three incident angles from 186–800 nm, corresponding to an energy range of 1.5–6.65 eV, in combination with optical reflection and transmission data. Optical constants were fit to these data simultaneously, using an optical model of the film that allowed for less dense (50%) interfacial layers at the substrate and the top surface of the film. From knowledge of the spectral dependence of optical properties, the film thickness corresponding to 180° phase shift, optical transmissivity, and reflectivity can be calculated.

More specifically, a general theoretical formalism for calculating the optical properties of superlattices or multilayered materials is disclosed in O. Hunderi, Effective Medium Theory and Nonlocal Effects for Superlattices, *J. of Wave-Material Interaction*, 2 (1987) pp. 29–39 and O. Hunderi, The Optical Properties of Thin Films and Superlattices, *Physica A*, 157 (1989) pp. 309–322, the disclosures of which are incorporated herein by reference. In the long wavelength limit, Hunderi and co-workers find that the multilayer stack behaves like a single film with an optic axis normal to the film and with an ordinary dielectric constant give by $$e_o = f_a\, e_a + f_t\, e_t$$

where $f_a$ and $f_t$ are the volume fractions of absorbing and transmitting layers, respectively, and $e_a$ and $e_t$ are their corresponding dielectric constants.

EXAMPLES

EXAMPLES 1–5

AlN/MoN$_x$ Photomask Blanks

Preparation and Physical Properties

We sputtered periodic multilayers of AlN/MoN$_x$ by pausing substrates on a rotating table consecutively under Mo and Al targets, which were physically apart in the vacuum chamber, so that their sputtered fluxes did not overlap. Sputtering was carried out in a 25% $N_2$/75% Ar gas mixture (total pressure 1.3×10−2 Pa) in order to form nitrides of Al and Mo. Individual AlN and MoN$_x$ thicknesses in these multilayers were fixed by programming the time substrates were paused under each target, using independently measured, static deposition rates: 1.0 Å/s for AlN and 0.86 Å for MoN$_x$ corresponding to 25 W and 284 volts applied to the Mo target, and 250 W and 190 V to the Al target. AlN was rf magnetron sputtered from a 5 cm diameter Al target, and MoN$_x$ was dc magnetron sputtered from a 7.6 cm diameter Mo target.

Prior to sputtering multilayers, Mo and Al targets were simultaneously presputtered in 1.3×10−2 Pa of Ar for about one hour in order to create fresh, reactive metallic target surfaces before introducing $N_2$. The Al target was presputtered at 300 W (360 volts) and the Mo target at 150 W (300 volts). The total film thickness, which was maintained close to 1000 Å, corresponds to a bilayer thickness (AlN+$MoN_x$) multiplied by the number of bilayers, N. Table 1 summarizes individual layer thicknesses, the total number of bilayers (N), and electrical sheet resistivities for AlN/$MoN_x$ multilayers. Even for AlN-rich compositions (Ex. 3 and 4), these multilayer films have relatively low resistivity, which is attractive for dissipating charge during e-beam writing.

TABLE 1

| Example | N | d(AlN), Å | d($MoN_x$), Å | % $MoN_x$ | R(W/sq) |
|---|---|---|---|---|---|
| 1 | 20 | 45 | 5 | 10 | ? |
| 2 | 20 | 40 | 10 | 20 | 3 M |
| 3 | 20 | 35 | 15 | 30 | 120 K |
| 4 | 20 | 25 | 25 | 50 | 30 K |
| 5 | 20 | 30 | 20 | 60 | ? |

Optical Properties

Figure 2:
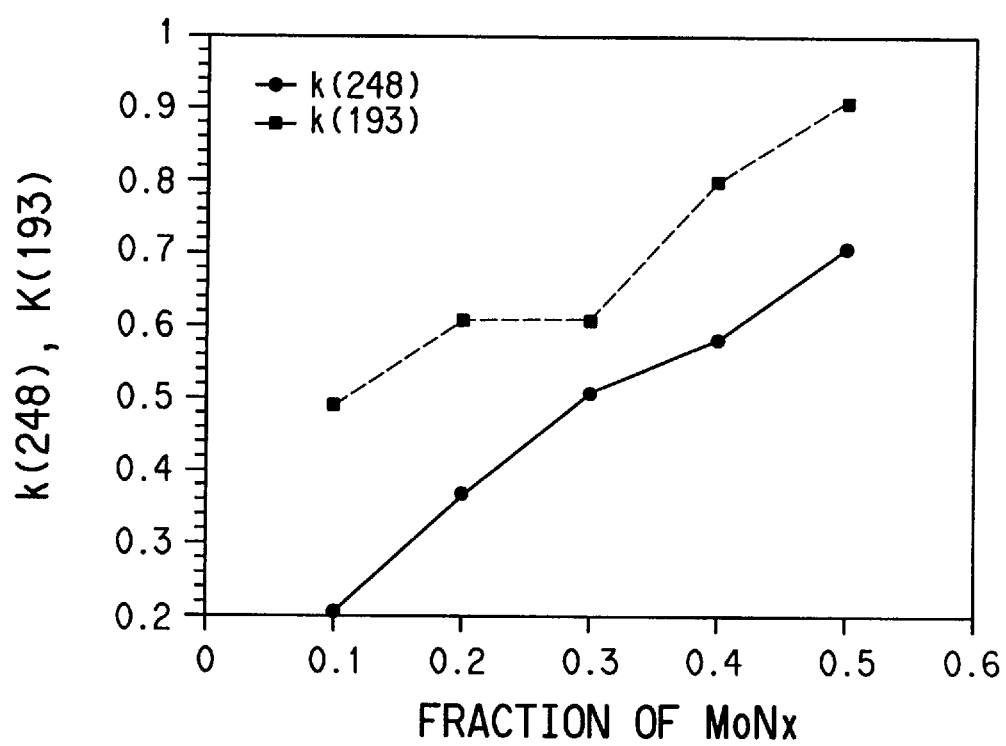
FIG. 2 is a graph showing the relationship between the extinction coefficient (k) and the % $MoNx$ in $AlN/MoNx$ photomask blanks of this invention.

FIGS. 1 and 2 summarize the dependence of optical constants, index of refraction (n) and extinction coefficient (k) at 248 nm and 193 nm, for AlN/$MoN_x$ multilayers as a function of the fraction of $MoN_x$. At both wavelengths, k increases nearly monotonically as the $MoN_x$ thickness increases, consistent with the higher absorption of $MoN_x$ there than AlN. At 248 nm the index of refraction is nearly independent of the fraction of $MoN_x$, whereas it drives values of n down at 193 nm. This is consistent with the metallic-like decrease in that occurs in n for $MoN_x$ with energy. At 248 nm n for AlN and MoNx are nearly equal, while at 193 nm, n becomes smaller for $MoN_x$ but larger for AlN, as its bandgap energy (~6.5 eV) is approached.

At 488 nm (2.54 eV), the wavelength commonly used for inspection of photomask blanks, the transmissions of Examples 2 and 3 were ~47% and ~35%, respectively, attractive for inspection of these photomask blanks.

Phase Shift Properties

Figure 3:
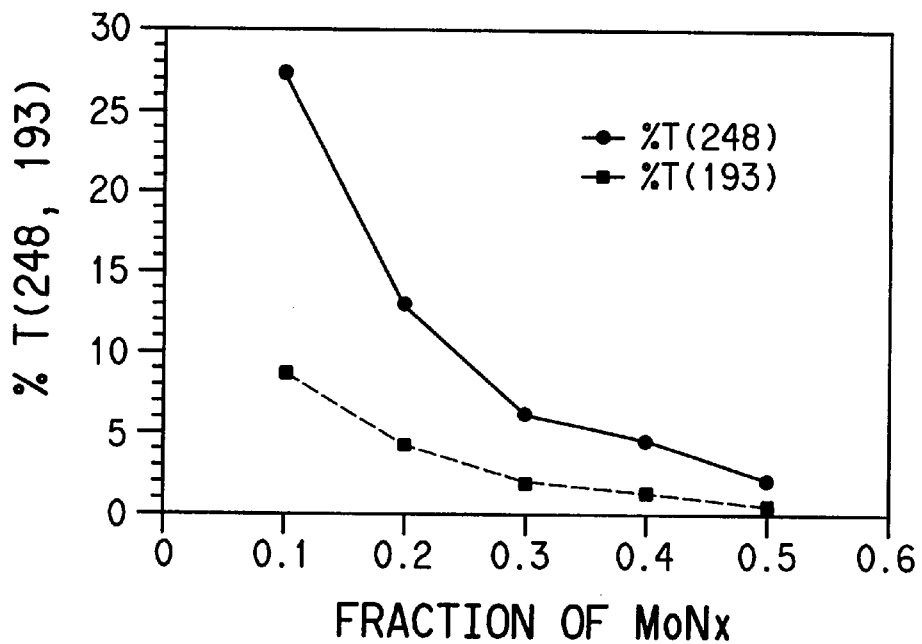
FIG. 3 is a graph showing the optical transmissivity (% T) of the $AlN/MoNx$ photomask blanks of this invention as a function of the % $MoNx$.

FIG. 3 summarizes the dependence of optical transmissivities, calculated for AlN/$MoN_x$ multilayer thicknesses that correspond to 180° phase shift at 193 nm and 248 nm, on the relative fraction of $MoN_x$. At 248 nm, acceptable transmissivities (5–10%) occur in the range 0.25–0.4 $MoN_x$, while at 193 nm they occur approximately in the range 0.1–0.2. Thus AlN/$MoN_x$ multilayers are an ideally tunable system for attenuating phase shift photomask blanks at 248 nm and 193 nm.

EXAMPLES 6–10

AlN/TiN Photomask Blanks

Preparation and Physical Properties

AlN/TiN multilayers were prepared by rf magnetron sputtering from a 5 cm diameter Al target and by dc magnetron sputtering from a 7.6 cm diameter Ti target in a reactive gas mixture of Ar and $N_2$. Both targets were presputtered in Ar before coating substrates, which were quartz, 2.5 cm×3.8 cm×2.286 mm thick. The static deposition rates for AlN and TiN, used for growth of multilayers in 1.3×10-2 Pa of a 75% Ar/25% $N_2$ gas mixture, were 1 Å/s and 1.1 Å/s respectively. To achieve these deposition rates, the Al target was operated at 250 W (210V) and the Ti target at 150 W (322V). Table 2 summarizes individual layer thicknesses, the total number of bilayers (N), and sheet resistivities for AlN/TiN multilayers.

TABLE 2

| Example | N | d(AlN), Å | d(TiN), Å | % TiN | R(W/sq) |
|---|---|---|---|---|---|
| 6 | 20 | 29 | 32 | 52 | 160 K |
| 7 | 20 | 34 | 26.5 | 44 | 1.2 M |
| 8 | 20 | 44 | 15.5 | 26 | 3.4 M |
| 9 | 20 | 54 | 15.5 | 22 | |
| 10 | 20 | 54 | 10 | 15.5 | |

Optical Properties

Figure 4:
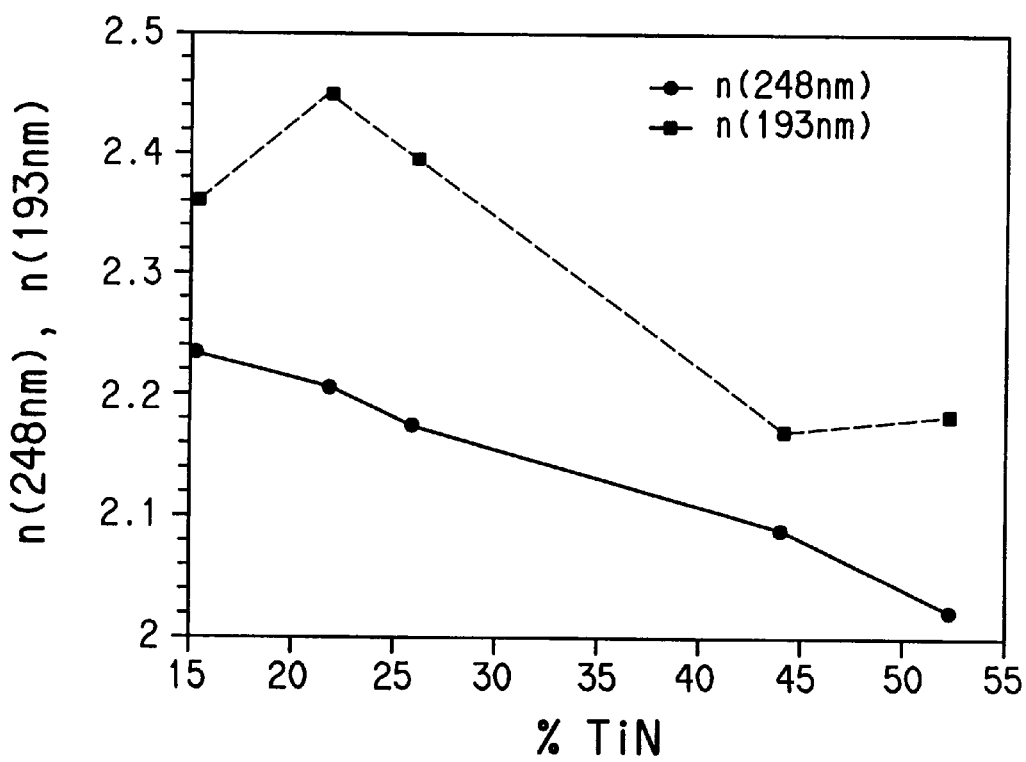
FIG. 4 is a graph showing the relationship between the index of refraction (n) and the % TiN in AlN/TiN photomask blanks of this invention.
Figure 5:
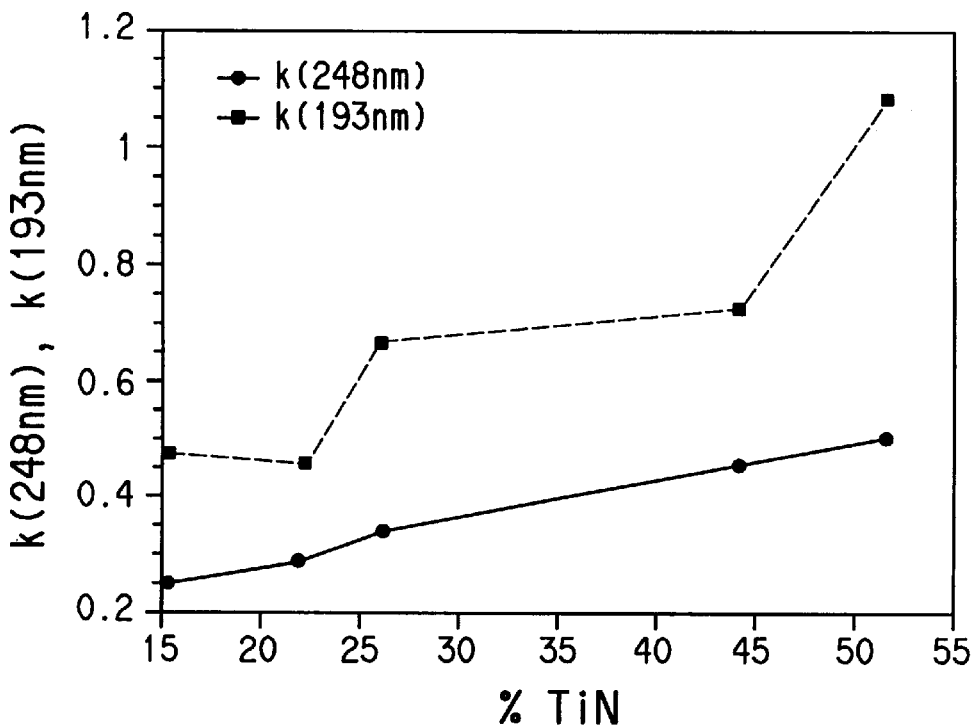
FIG. 5 is a graph showing the relationship between the extinction coefficient (k) and the % TiN in AlN/TiN photomask blanks of this invention.

FIGS. 4 and 5 summarize the dependence of the index of refraction and extinction coefficient on % TiN in AlN/TiN multilayers. These trends are consistent with the smaller n and larger k for TiN than for AlN at 248 nm and 193 nm. At 488 nm, the wavelength commonly used for inspection of photomask blanks, the transmission in Example 7 was attractively low, ~40%.

Phase Shift Properties

Figure 6:
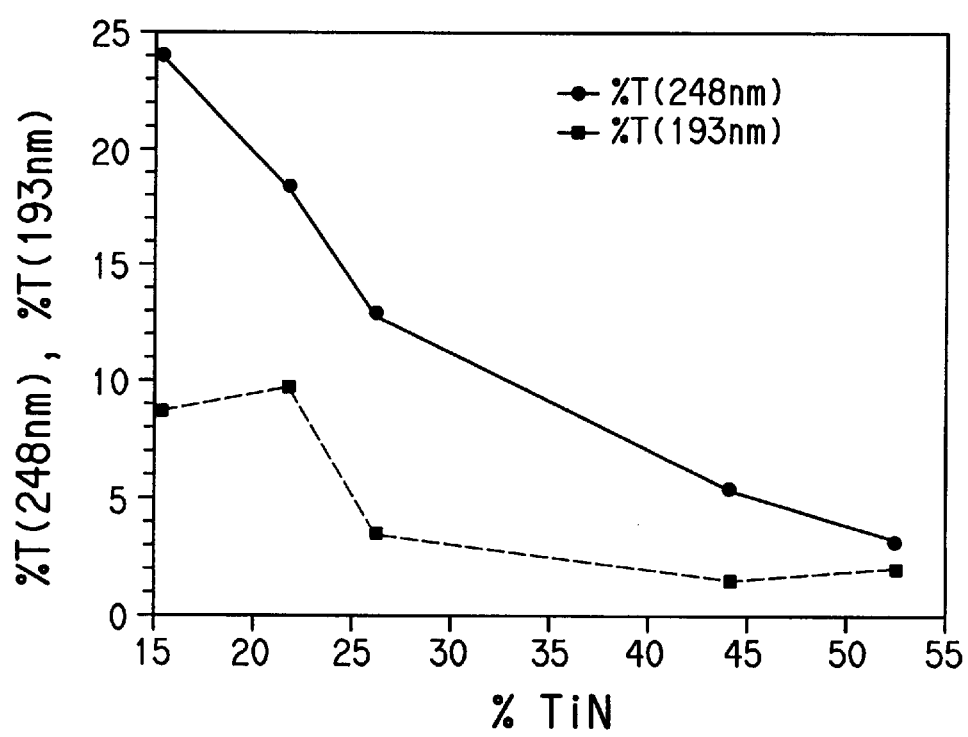
FIG. 6 is a graph showing the optical transmissivity (% T) of the AlN/TiN photomask blanks of this invention as a function of the % TiN.

FIG. 6 summarizes the dependence of optical transmissivities, calculated for AlN/TiN multilayer thicknesses, corresponding to 180° phase shift at 193 nm and 248 nm, on the % TiN. At 248 nm, acceptable transmissivities (5–10%) occur in the range 33–45% TiN, while at 193 nm similar transmissivities occur approximately in the range 15–25%. Thus AlN/TiN multilayers are an ideally tunable system for attenuating phase shift photomask blanks at 248 nm and 193 nm.

EXAMPLES 11–14

$RuO_2$/$HfO_2$ Photomask Blanks

Preparation and Physical Properties $RuO_2$/$HfO_2$ multilayers were prepared by dc magnetron sputtering from a 5 cm diameter Ru target and by rf magnetron sputtering from 7.6 cm diameter Hf target reactively in a 10% partial pressure of O2 in 1.3×10-2 Pa total pressure of Ar+$O_2$. Substrates were 2.5 cm×3.8 cm×0.2286 mm quartz, paused under each target consecutively to form the multilayers. Static deposition rates, measured for each target, were used to calculate the time substrates were paused under each target to produce specific layer thicknesses. In Examples 11–13 the $RuO_2$ deposition rate was 0.79 Å/s, while it was 3.3 Å for Example 14; this corresponded to 25 W(528 V) and 50 W (619 V) applied to the Ru target, respectively. In all of these examples, the power applied to the hafnium target was 300 W (270 V). Before depositing multilayers, both the Hf and Ru targets were presputtered in 1.3×10-2 Pa Ar for a least 30 minutes to form clean, metallic surfaces, before introducing $O_2$ gas. Table 3 summarizes approximate individual layer thicknesses, the total number of bilayers (N), and sheet resistivities for four $RuO_2$/$HfO_2$ multilayers. All of the resistivities were sufficiently low to dissipate charge during e-beam writing.

TABLE 3

| Example | N | d($RuO_2$), Å | d($HfO_2$), Å | % $RuO_2$ | R(W/sq) |
|---|---|---|---|---|---|
| 11 | 20 | 10 | 40 | 20 | 20 K |
| 12 | 20 | 15 | 35 | 30 | 700 |
| 13 | 20 | 20 | 30 | 40 | 200 |
| 14 | 20 | 25 | 25 | 50 | 600 |

Optical Properties

Figure 7:
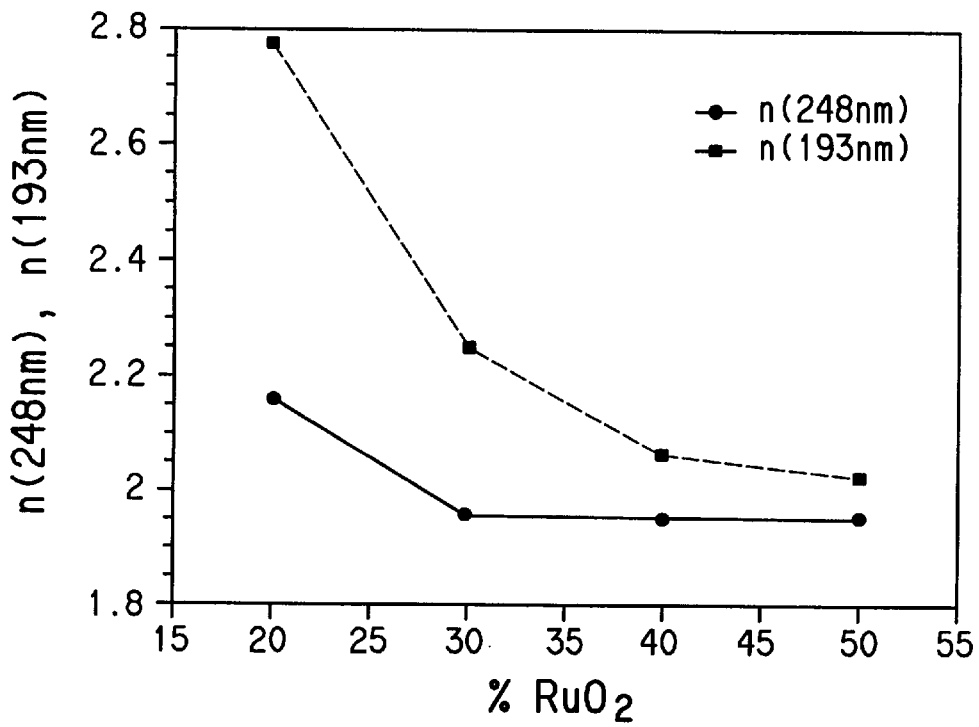
FIG. 7 is a graph showing the relationship between the index of refraction (n) and the % RuO2 in RuO2/HfO2 photomask blanks of this invention.
Figure 8:
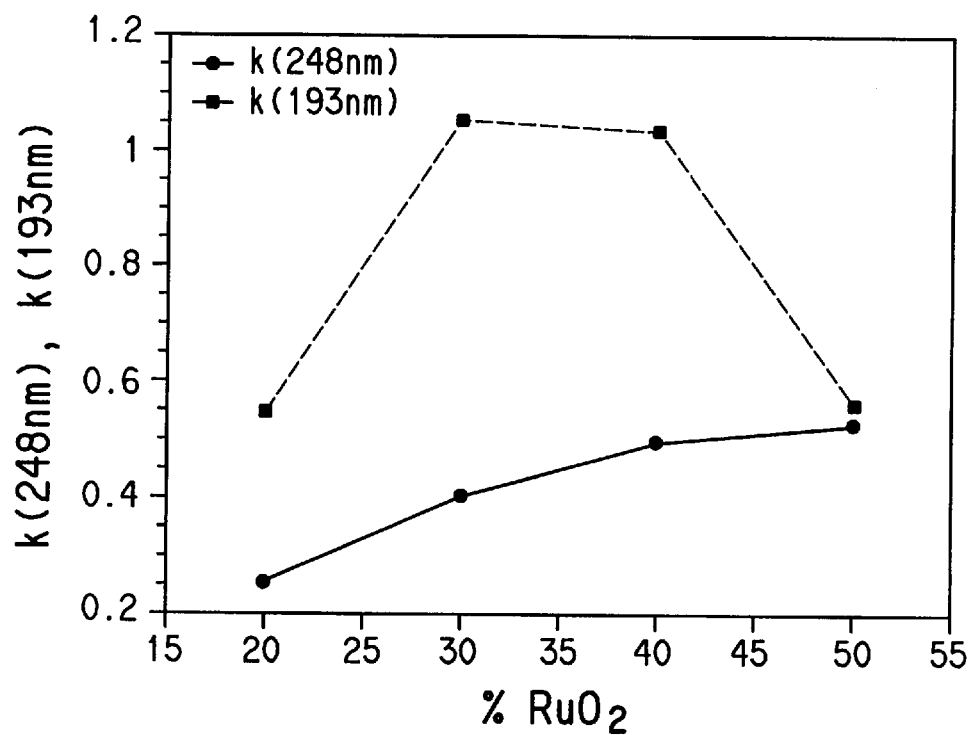
FIG. 8 is a graph showing the relationship between the extinction coefficient (k) and the % RuO2 in RuO2/HfO2 photomask blanks of this invention.

FIGS. 7 and 8 summarize the dependence of the index of refraction and extinction coefficient on the % $RuO_2$ in RuO$_2$/HfO$_2$ multilayers at 248 nm and 193 nm. The general trend is to reduce n and increase k with increasing RuO$_2$ content. However, the reduction in k at 50% RuO$_2$ and 193 nm, reflects a difference in the optical properties of this RuO$_2$ layer, which was sputtered at 3.3 Å/s compared to 0.79 Å/s for others, since its extinction coefficient is sensitive to deposition conditions. That is, films sputtered with more O2 become less crystalline and have a larger extinction coefficient at 193 nm than films sputtered in lower concentrations of O$_2$. Increasing the sputtering rate, while maintaining the same O$_2$ partial pressure, as in Example 14, is equivalent to reducing the partial pressure at the target surface, which consumes O$_2$. At 488 nm, the wavelength commonly used for inspection of photomask blanks, the transmission for all of the RuO$_2$/HfO$_2$ multilayers was less than 45%, attractive for inspection.

Phase Shift Properties

Figure 9:
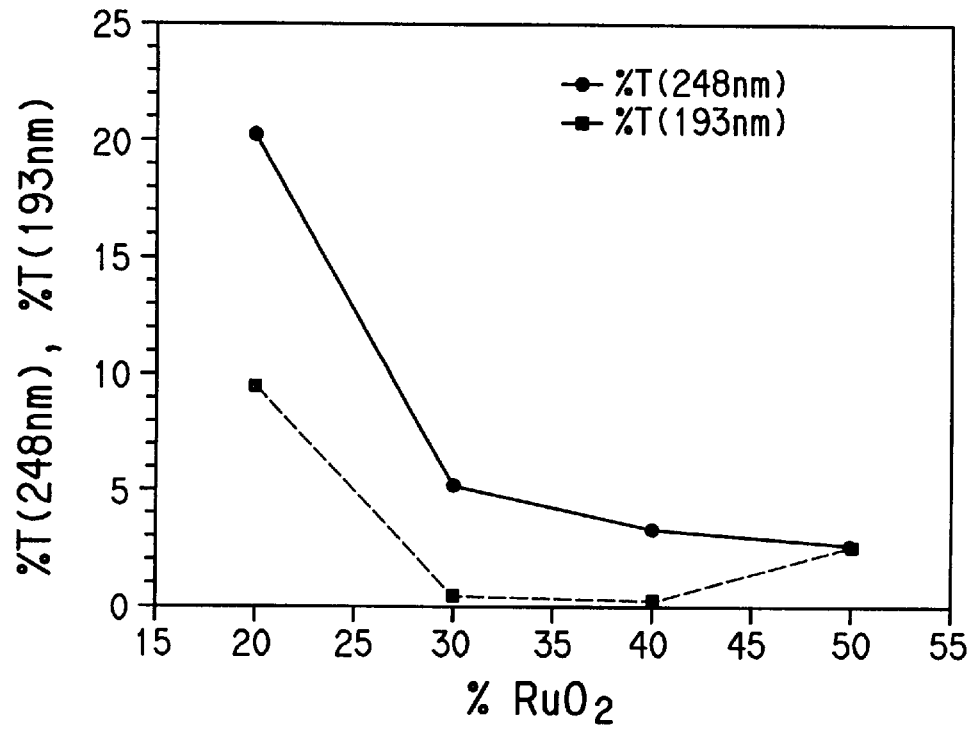
FIG. 9 is a graph showing the optical transmissivity (% T) of RuO2/HfO2 photomask blanks of this invention as a function of the % RuO2.

FIG. 9 summarizes the dependence of optical transmissivities, calculated for RuO$_2$/HfO$_2$ multilayer thicknesses, corresponding to 180° phase shift at 193 nm and 248 nm, on the % RuO$_2$. At 248 nm, acceptable transmissivities (5–12%) occur in the range 25–30% RuO$_2$, while at 193 nm similar transmissivities occur approximately in the range ~17–25%. Thus RuO$_2$/HfO$_2$ multilayers are an ideally tunable system for attenuating phase shift photomask blanks at 248 nm and 193 nm.

EXAMPLES 15–19

RuO$_2$/ZrO$_2$ Photomask Blanks

Preparation and Physical Properties

RuO$_2$/ZrO$_2$ multilayers were made by rf magnetron sputtering from a 7.6 cm diameter Zr target and by dc magnetron from a 5 cm diameter Ru target, reactively in a 10% O$_2$/90% Ar atmosphere at a total pressure of 1.3×10-2 Pa. For multilayer synthesis, 25 W at 515 V was applied to the Ru target, while 300 W at 280 V was applied to the Zr target. For these conditions, the static deposition rates on substrates were 0.79 Å/s for RuO$_2$ and 0.77 Å/s for ZrO$_2$. Multilayers of RuO$_2$/ZrO$_2$ were made in the usual manner by pausing quartz substrates under each target, consecutively, after presputtering the Ru and Zr targets in 1.3×10-2 Pa Ar. Table 4 summarizes the composition and sheet resistivities of RuO$_2$/ZrO$_2$ multilayers, whose optical properties were measured to determine their efficacy as attenuating phase shift photomask blanks. Examples 16–18 had sheet resistivities £1 MW/square, attractive for dissipating charge in e-beam writing.

TABLE 4

| Example | N | d(RuO$_2$), Å | d(ZrO$_2$), Å | % RuO$_2$ | R(W/sq) |
|---|---|---|---|---|---|
| 15 | 20 | 10 | 40 | 20 | |
| 16 | 20 | 15 | 35 | 30 | 1 M |
| 17 | 20 | 20 | 30 | 40 | 20 K |
| 18 | 20 | 25 | 25 | 50 | 1.4 K |

Optical Properties

Figure 10:
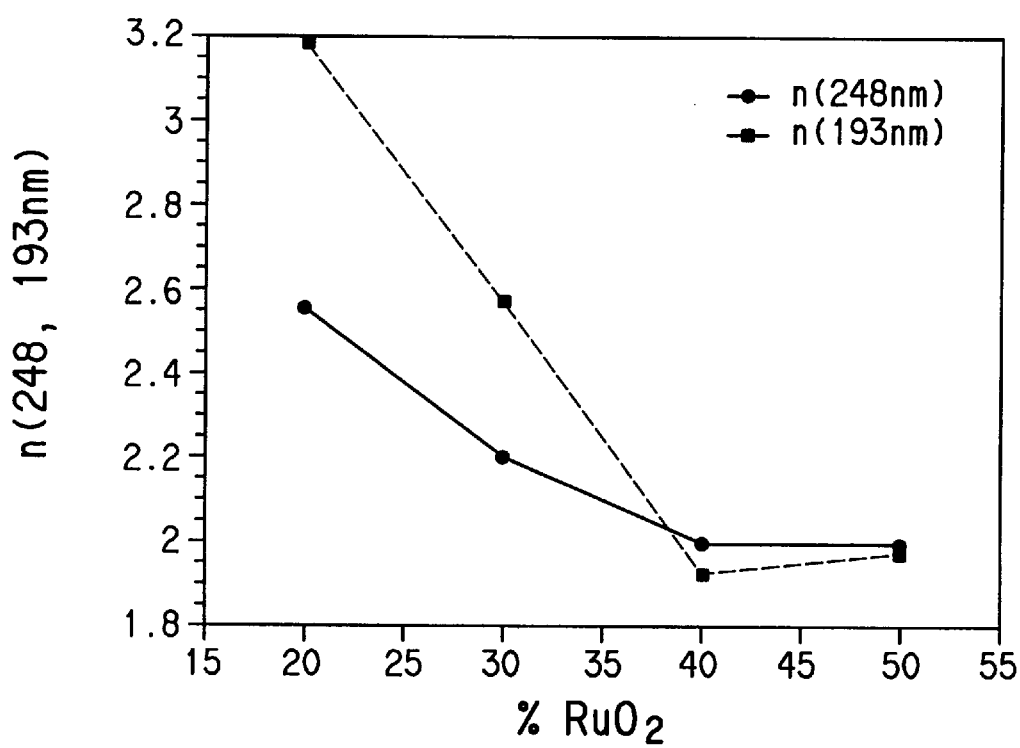
FIG. 10 is a graph showing the relationship between the index of refraction (n) and the % RuO2 in RuO2/ZrO2 photomask blanks of this invention.
Figure 11:
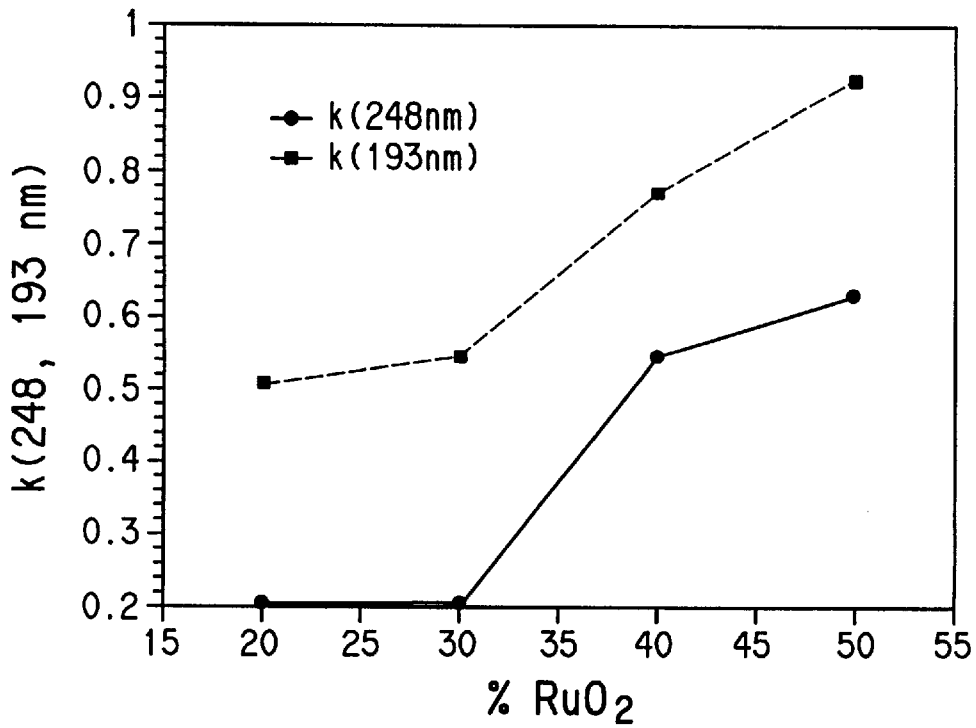
FIG. 11 is a graph showing the relationship between the extinction coefficient (k) and the % RuO2 in RuO2/ZrO2 photomask blanks of this invention.

FIGS. 10 and 11 summarize the dependence of the index of refraction and extinction coefficient on the % RuO$_2$ in RuO$_2$/ZrO$_2$ multilayers at 248 nm and 193 nm. As in similar multilayers with HfO$_2$, for ZrO$_2$ the general trend is a reduction in n and an increase in k with increasing RuO$_2$ content.

Phase Shift Properties

Figure 12:
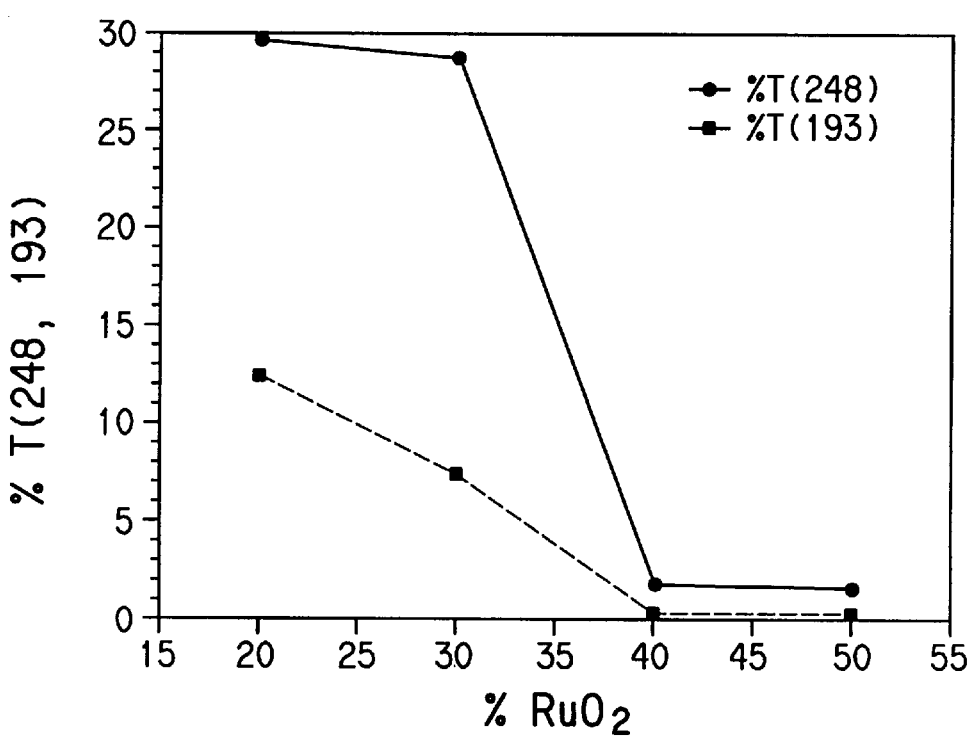
FIG. 12 is a graph showing the optical transmissivity (% T) of the RuO2/ZrO2 photomask blanks of this invention as a function of the % RuO2.

FIG. 12 summarizes the dependence of optical transmissivities, calculated for RuO$_2$/ZrO$_2$ multilayer thicknesses, corresponding to 180° phase shift at 193 nm and 248 nm, on the % RuO$_2$. At 248 nm, acceptable transmissivities (5–15%) occur in the range 35–40% RuO$_2$, while at 193 nm similar transmissivities occur approximately in the range ~20–35%. Thus RuO$_2$/ZrO$_2$ multilayers are an ideally tunable system for attenuating phase shift photomask blanks at 248 nm and 193 nm.

EXAMPLES 20–21

Aperiodic AlN/MoN$_x$ Photomask Blanks

Figure 13:
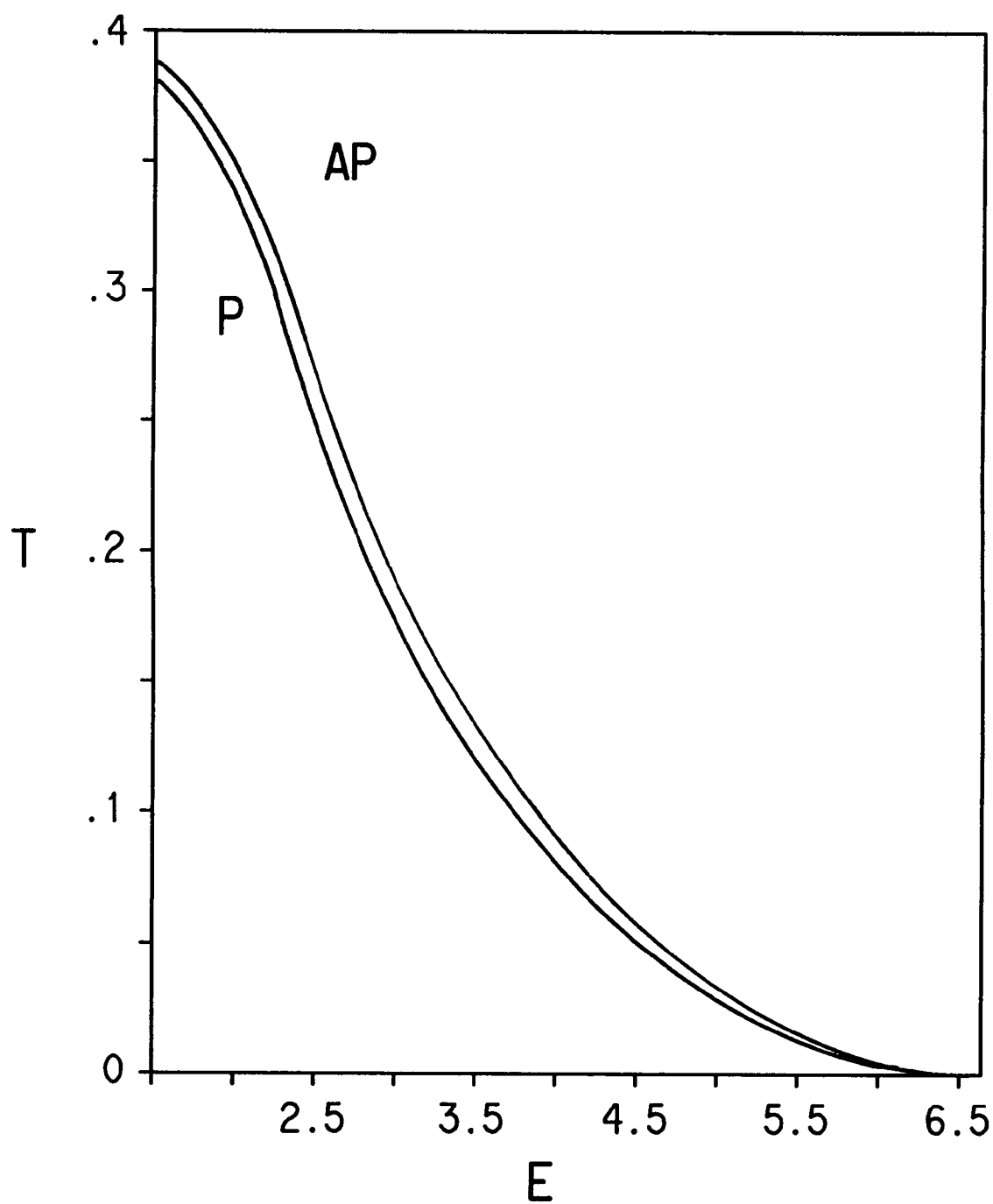
FIG. 13 is a graph showing the optical transmission (% T) as a function of energy (E) for AlN/MoN$x$ photomask blanks according to the invention.
Figure 14:
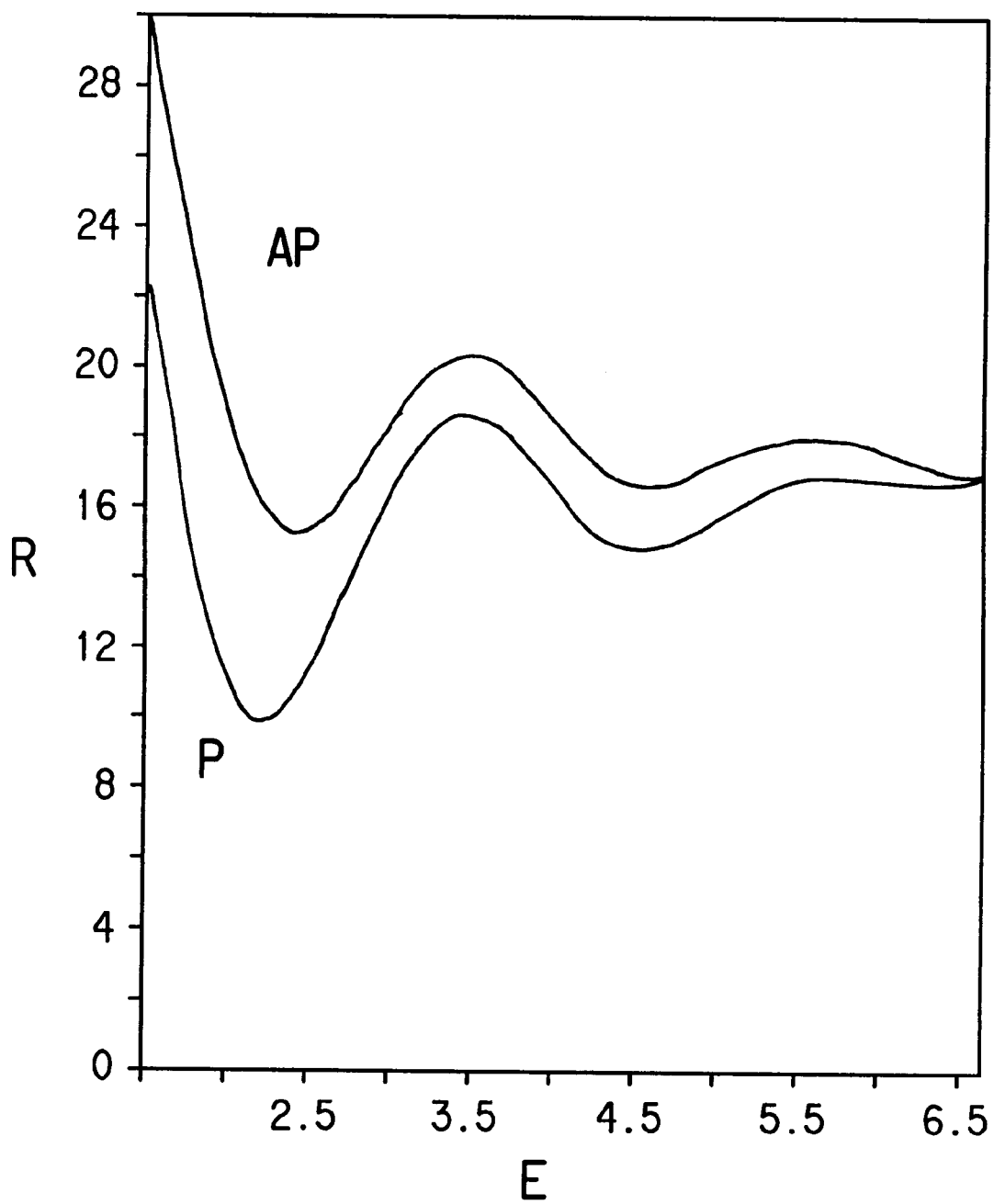
FIG. 14 is a graph showing the optical reflectivity (% R) as a function of energy (E) for AlN/MoN$x$ photomask blanks according to the invention.

Examples 20 and 21 illustrate how it is possible to tailor optical properties of multilayer photomask blanks by aperiodic stacking of individual layers. The multilayer of Example 20 is a periodic stacking of AlN/MoN$_x$:20×(40 ÅAlN+20 Å MoN$x$), whereas Example 21 is comprised of an aperiodic stacking: [12×(40 Å AlN+10 Å MoN$_x$)+5(40 Å AlN+30 Å MoN$_x$)+3(40 Å AlN+50 Å MoN$_x$], with thicker MoN$_x$ layers at the film/air interface. Both multilayer stacks contain the same amount of AlN (800 Å) and MoN$_x$ (420 Å), and their optical transmissions, shown in FIG. 13 versus energy, are nearly identical everywhere. However, the reflectivity (FIG. 14) of Example 21 with the more metal-like, MoN$_x$-rich surface has a 50% larger reflectivity (~15% compared to 10%) at ~2.2 eV, near the inspection energy of 2.54 eV (488 nm). Thus it is possible with aperiodic stacking to tailor a specific optical property, such as reflectivity, while maintaining the same optical transmission and phase shift.

What is claimed is:

1. An attenuating embedded phase shift photomask blank capable of producing a phase shift of 180° with an optical transmissivity of at least 0.001 a selected lithographic wavelength <400 nm, said photomask blank comprising distinct alternating layers of an optically transparent material and layers of an optically absorbing material.

2. The photomask blank of claim 1, wherein the optically transparent material is selected from the group consisting of metal oxides, metal nitrides, alkaline earth metal flourides, and mixtures thereof.

3. The photomask blank of claim 1, wherein the optically transparent material is selected from the group consisting of (a) oxides of Hf, Y, Zr, Al, Si, or Ge; (b) nitrides of Al, Si, B, or C; (c) fluorides of Mg, Ba, or Ca, and (d) mixtures thereof.

4. The photomask blank of claim 1, wherein the optically absorbing material is selected from the group consisting of elemental metals, metal oxides, metal nitrides and mixtures thereof.

5. The photomask blank of claim 1, wherein the optically absorbing material is selected from the group consisting of (a) oxides of Cr, Ti, Fe, In, Co, Bi, Mn, Cu, Sn, Ni, V, Ta, Mo, Ru, metals in the lanthanide series, or W; (b) nitrides of Ti, Nb, Mo, W, Ta, Hf, Y, Zr, or Cr; (c) elemental metals; and (d) mixtures thereof.

6. The photomask blank of claim 1, comprising at least two layers of optically transparent material and at least two layers of optically absorbing material.

7. The photomask blank of claim 1, wherein the alternating layers are periodic.

8. The photomask blank of claim 1, wherein the alternating layers are aperiodic.

9. A process of making attenuating embedded phase shift photomask blanks capable of producing a phase shift of 180° with an optical transmissivity of at least 0.001 at a selected lithographic wavelength <400 nm, said process comprising the steps of depositing distinct alternating layers of an optically transparent material and layers of an optically absorbing material onto a substrate.

10. The process of claim 9, wherein the alternating layers are periodic.

11. The process of claim 9, wherein the alternating layers are aperiodic.

12. The process of claim 9, wherein at least two layers of optically transparent material are deposited and wherein at least two layers of optically absorbing material are deposited.

13. The process of claim 9, wherein the optically transparent material is selected from the group consisting of metal oxides, metal nitrides, alkaline earth metal fluorides, and mixtures thereof.

14. The process of claim 9, wherein the optically transparent material is selected from the group consisting of (a) oxides of Hf, Y, Zr, Al, Si, or Ge; (b) nitrides of Al, Si, B, or C; (c) fluorides of Mg, Ba, or Ca, and (d) mixtures thereof.

15. The process of claim 9, wherein the optically absorbing materials is selected from the group consisting ofelemental metals, metal oxides, metal nitrides, and mixtures thereof.

16. The process of claim 9, wherein the optically absorbing material is selected from the group consisting of (a) oxides of Cr, Ti, Fe, In, Co, Bi, Mn, Cu, Sn, Ni, V, Ta, Mo, Ru, metals in the lanthanide series, or W; (b) nitrides of Ti, Nb, Mo, W, Ta, Hf, Zr, or Cr; (c) elemental metals; and (d) mixtures thereof.

17. The process of claim 9, wherein the alternating layers are deposited by vapor deposition.

18. The process of claim 9, wherein the layers are deposited by sputter deposition.

* * * * *